United States Patent
Bachschmidt et al.

(10) Patent No.: US 10,386,441 B2
(45) Date of Patent: Aug. 20, 2019

(54) METHOD AND APPARATUS FOR ATTENUATION CORRECTION OF EMISSION TOMOGRAPHY SCAN DATA

(71) Applicant: Siemens Aktiengesellschaft, Munich (DE)

(72) Inventors: Theresa Bachschmidt, Nuremberg (DE); Matthias Fenchel, Erlangen (DE); Bjoern Jakoby, Nuremberg (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 612 days.

(21) Appl. No.: 15/061,127

(22) Filed: Mar. 4, 2016

(65) Prior Publication Data

US 2016/0259024 A1    Sep. 8, 2016

(30) Foreign Application Priority Data

Mar. 5, 2015    (DE) .................. 10 2015 203 932

(51) Int. Cl.
*G01R 33/565* (2006.01)
*G01R 33/48* (2006.01)
*G01T 1/16* (2006.01)

(52) U.S. Cl.
CPC ..... *G01R 33/56563* (2013.01); *G01R 33/481* (2013.01); *G01T 1/1603* (2013.01)

(58) Field of Classification Search
None
See application file for complete search history.

(56) References Cited

U.S. PATENT DOCUMENTS

| | | | |
|---|---|---|---|
| 2010/0033179 A1* | 2/2010 | Hargreaves | G01R 33/4833 324/309 |
| 2012/0139539 A1 | 6/2012 | Nittka | |
| 2012/0265050 A1* | 10/2012 | Wang | A61B 5/055 600/411 |

(Continued)

OTHER PUBLICATIONS

Aboelmagd et al., "Magnetic resonance imaging of metal artifact reduction sequences in the assessment of metal-on-metal hip prostheses," Reports in Medical Imaging, vol. 7, pp. 65-74 (2014).

(Continued)

*Primary Examiner* — Jermele M Hollington
*Assistant Examiner* — Suresh K Rajaputra
(74) *Attorney, Agent, or Firm* — Schiff Hardin LLP (57) ABSTRACT

In a method for attenuation correction of emission tomography scan data acquired from an examination object in a combined magnetic resonance emission tomography apparatus, wherein an interference object is situated in the examination region, which causes a magnetic interference field during combined magnetic resonance emission tomography imaging, magnetic resonance scan data of the examination object are acquired by executing a magnetic resonance sequence designed to at least partially compensate inference due to the magnetic interference field. Emission tomography scan data are acquired and an attenuation map is generated using the acquired magnetic resonance scan data. Attenuation correction of the emission tomography scan data is implemented using the generated attenuation map.

12 Claims, 3 Drawing Sheets

(56) References Cited

U.S. PATENT DOCUMENTS

| | | | |
|---|---|---|---|
| 2013/0237806 A1 | 9/2013 | Blumhagen et al. | |
| 2013/0320973 A1* | 12/2013 | Fenchel | A61B 5/055 324/309 |
| 2014/0046171 A1 | 2/2014 | Schmidt | |
| 2014/0125335 A1* | 5/2014 | Li | G01R 33/4822 324/309 |
| 2014/0153806 A1* | 6/2014 | Glielmi | G01R 33/481 382/131 |
| 2015/0196222 A1* | 7/2015 | Stehning | A61B 6/037 600/411 |
| 2017/0371010 A1* | 12/2017 | Shanbhag | G01R 33/243 |

OTHER PUBLICATIONS

Cho et al., "Total inhomogeneity correction including chemical shifts and susceptibility by view angle tilting," Med Phys., vol. 15, pp. 7-11 (1988).

Burger et al., "Hybrid PET/MR Imaging: An Algorithm to Reduce Metal Artifacts from Dental Implants in Dixon-Based Attenuation Map Generation Using a Multiacquisition Variable-Resonance Image Combination Sequence," J. Nucl. Med., vol. 56, pp. 93-97 (2015).

Koch et al., "A Multispectral Three-Dimensional Acquisition Technique for Imaging Near Metal Implants," Magnetic Resonance in Medicine, vol. 61, pp. 381-390 (2009).

Robson et al., "Magnetic Resonance: An Introduction to Ultrashort TE (UTE) Imaging," J Comput Assist Tomogr., vol. 27, Nr. 6 (2003).

Carl et al., "MR Imaging Near Metal With Undersampled 3D Radial UTE-MAVRIC Sequences," Magnetic Resonance in Medicine, vol. 69, pp. 27-36 (2013).

Hofmann et al., "MRI-Based Attenuation Correction for Whole-Body PET/MRI: Quantitative Evaluation of Segmentation- and Atlas-Based Methods," The Journal of Nuclear Medicine, vol. 52, No. 9, pp. 1392-1399 (2011).

Bezrukov et al., "MR-Based Attenuation Correction Methods for Improved PET Quantification in Lesions Within Bone and Susceptibility Artifact Regions," The Journal of Nuclear Medicine, vol. 54, No. 10, pp. 1768-1774 (2013).

* cited by examiner

FIG 4

METHOD AND APPARATUS FOR ATTENUATION CORRECTION OF EMISSION TOMOGRAPHY SCAN DATA

BACKGROUND OF THE INVENTION

Field of the Invention

The invention concerns a method for attenuation correction of emission tomography scan data, as well as a combined magnetic resonance emission tomography apparatus and a non-transitory, computer-readable data storage medium encoded with programming instructions, for implementing such a method.

Description of the Prior Art

In the scanner of a magnetic resonance apparatus, also called a magnetic resonance tomography system, the body of an examination person, in particular a patient, to be examined is conventionally exposed by a basic field magnet to a relatively high basic magnetic field, for example of 1.5 or 3 or 7 tesla. In addition, gradient switching operations occur with the use of a gradient coil unit. Radio-frequency pulses, for example excitation pulses, are then emitted by a radio-frequency antenna unit by suitable antenna devices, and this leads to the nuclear spins of specific atoms, which are excited in a resonant manner by these radio-frequency pulses, being tilted by a defined flip angle with respect to the magnetic field lines of the basic magnetic field. When the nuclear spins are relaxed, radio-frequency signals, known as magnetic resonance signals, are radiated from the atoms, which are received by suitable radio-frequency antennae and then processed further. Finally, the desired image data can be reconstructed from the raw data acquired in this way.

For a specific measurement, a specific magnetic resonance sequence, also called a pulse sequence, is therefore to be emitted, which includes a sequence of radio-frequency pulses, for example excitation pulses and refocusing pulses, and appropriate gradient switching operations that are to be emitted in a coordinated manner in various gradient axes in various spatial directions. At a time appropriate therewith readout windows are set, and these specify the periods in which the induced magnetic resonance signals are detected.

Positron emission tomography (PET) and single photon emission computed tomography (SPECT) are imaging methods in nuclear medicine in which sectional images of an examination object are typically generated by scanning and rendering visible the distribution of a weakly radioactively marked substance in the body of the examination object using a radiation detector, in particular a specially designed PET detector or SPECT detector. Biochemical and physiological processes in an organ of the examination object can be depicted in this way. Before an examination, the examination object is injected with a radionuclide or a substance marked with a radionuclide.

The radionuclide emits positrons for a PET examination. When a positron interacts with an electron in the body of the examination object, two photons are emitted in opposing directions and the coincident detection thereof is registered using the PET detector of the PET apparatus. The spatial distribution of the radionuclide inside the body can be ascertained and sectional images of the inside of the body of the living organism can be generated from the registered random events.

To evaluate the results of an emission tomography scan, an attenuation map is required, which is a spatially resolved distribution of the attenuation values of the tissue of the current examination object. The attenuation values are typically stored in the form of linear attenuation coefficients with the unit 1/cm. The tissue of the examination object, which is located between the point of origin of the photons and the emission tomography detector, is especially relevant with respect to the attenuation correction. During the evaluation the emission tomography scan data are corrected with the use of the attenuation map. In the case of PET imaging the attenuation map includes, in particular, the attenuation values with respect to photons with an energy of 511 keV.

Medical examinations are often carried out by combined medical imaging devices that have more than one imaging modality, typically two imaging modalities. In these medical examinations diagnostic, scan data are acquired, in particular simultaneously, from an examination object by the multiple, in particular two, imaging modalities. The evaluation of the diagnostic image data reconstructed from the diagnostic scan data is thereby facilitated for a competent person, since the image data of the two imaging modalities are available to such a person. Combined magnetic resonance emission tomography devices, for example, are known. These include a combined magnetic resonance positron emission tomography device (magnetic resonance PET device) or a combined magnetic resonance single photon emission computed tomography device (magnetic resonance SPECT device).

The attenuation map for the attenuation correction of the emission tomography scan data is typically generated on the basis of magnetic resonance scan data. For example, magnetic resonance scan data can be used that have been acquired by execution of a gradient echo-based sequence. The advantage thereof is a short acquisition time, so that three dimensional magnetic resonance scan data for generating the attenuation map can be acquired during a breath-hold by the examination object in order to minimize movement artifacts due to breathing.

In magnetic resonance imaging, there is often an interference object in the examination object which disturbs the magnetic resonance imaging at least locally. An interference object of this kind can be, for example, metal. Possible interference objects are, for example, dental implants, dental braces, clips from operations (primarily in the thorax region), cardiac pacemakers, screws (primarily in the region of the spine) or joint replacement parts, such as, for example, knee implants or hip implants. The interference object can cause a magnetic interference field that results primarily from the different magnetic susceptibility of the metal contained in the interference object, compared to surrounding tissue. The magnetic interference field can lead to susceptibility artifacts that typically increase with the strength of the basic magnetic field of the magnetic resonance device.

This interference field, in particular the susceptibility artifacts, can lead to signal cancellations in the magnetic resonance scan data. It is also conceivable for the interference field to lead to signal enhancements. In general the interference field can lead to signal changes which shall hereinafter include signal cancellations and/or signal enhancements. A suitable attenuation value for these signal changes typically cannot be ascertained from the magnetic resonance scan data during generation of the attenuation map. This can lead to locally incorrect emission tomography image data that have been attenuation corrected by an attenuation map of this kind.

SUMMARY OF THE INVENTION

An object of the invention is to enable improved attenuation correction of emission tomography scan data in the environment of an interference object.

The inventive method for attenuation correction of emission tomography scan data for combined magnetic resonance emission tomography imaging of an examination object in an examination region, an interference object, which causes a magnetic interference field during combined magnetic resonance emission tomography imaging, is situated in the examination region, has the following method steps.

Magnetic resonance scan data of the examination object are acquired by operation of a magnetic resonance data acquisition scanner so as to execute a magnetic resonance sequence designed to at least partially compensate inference due to the magnetic interference field.

Emission tomography scan data of the examination object are acquired by operation of an emission tomography data acquisition scanner that is combined with the magnetic resonance scanner.

An attenuation map is generated in a processor using the acquired magnetic resonance scan data.

Attenuation correction of the emission tomography scan data is implemented by the processor using the generated attenuation map.

The examination object can be a patient, training person, an animal or a phantom. The examination region, also called a recording volume (field of view, FOV), is a volume that is mapped in magnetic resonance image data and/or emission tomography image data. The examination region is typically defined by a user, for example on a topogram (localizer image). Of course the examination region can alternatively or additionally be defined automatically, for example on the basis of a chosen protocol.

The interference object is distinguished by having a magnetic susceptibility that differs from the magnetic susceptibility of a material, in particular tissue, surrounding the interference object. In particular, the magnetic susceptibility of the interference object is higher, usually more than twice as high, or more than five times as high, or more than ten times as high, or more than fifteen times as high, as the magnetic susceptibility of the material that surrounds the interference object. This interference object can therefore produce the magnetic interference field, which can make mapping of the interference object difficult and/or lead to image artifacts in the vicinity of the interference object in the magnetic resonance scan data.

The magnetic resonance scan data and emission tomography scan data can be at least partially simultaneously acquired. The magnetic resonance scan data and emission tomography scan data are advantageously simultaneously acquired for the most part, most advantageously completely simultaneously. This means that the emission tomography scan data are acquired from the examination object at the same time as the magnetic resonance scan data. The duration of the combined magnetic resonance emission tomography examination can be reduced in this way. It can also be ensured that the emission tomography scan data are advantageously matched to the magnetic resonance scan data since, for example, there is identical positioning of the examination object during acquisition of the emission tomography scan data and the magnetic resonance scan data.

The attenuation map can be generated using the magnetic resonance scan data such that information about a spatially resolved distribution of attenuation values of a tissue of the examination object is ascertained by the magnetic resonance scan data. Emission tomography image data can be generated by means of attenuation correction of the emission tomography scan data. The generated emission tomography image data emitted from the processor in electronic form as a data file, and can be displayed on a display unit for a user and/or stored in a database.

The magnetic resonance sequence used to acquire the magnetic resonance scan data has suitable sequence parameters so that the inference due to the magnetic interference field can be compensated. The magnetic resonance sequence, in particular the sequence parameters, are designed such that a signal cancellation in the vicinity of the interference object is reduced. In particular, due to the appropriate magnetic resonance sequence having the appropriate sequence parameters, the signal cancellation is reduced compared to a magnetic resonance sequence having standard sequence parameters that is conventionally used to generate the attenuation map. The magnetic resonance sequence can include sequence components that actively contribute to a reduction in the signal cancellation caused by a magnetic interference field. The fact that the magnetic interference field is compensated means that the effect of the presence of the interference object is largely reduced. For example, it is possible that the interference object may no longer be seen at all in the magnetic resonance scan data, due to the compensation of the magnetic interference field.

There are various possibilities, which are described in more detail in the following, for at least partial compensation of the magnetic interference field. A magnetic resonance sequence, which is dedicated to correcting metal artifacts, can be executed to acquire the magnetic resonance scan data. An appropriate choice of sequence parameters of the magnetic resonance sequence, for example an excitation bandwidth, a readout bandwidth, an echo time, a resolution or a gradient field strength, can also be made. Advantageous post processing of the magnetic resonance scan data, for example suitable filling of signal cancellations, is also conceivable for generation of the attenuation map.

The magnetic resonance scan data acquired in this way can form a particularly advantageous basis for the generation of the attenuation map. Signal changes due to the interference object can be at least partially, preferably completely, avoided in the attenuation map generated in this way. Particularly accurate and/or reliable attenuation correction of the emission tomography scan data by the thus-generated attenuation map can be achieved, in particular locally in the vicinity of the interference object. The emission tomography image data reconstructed in this way can have fewer artifacts due to the interference object and/or improved image quality, in the spatial environment of the interference object.

In an embodiment, magnetic resonance image data are generated from the magnetic resonance scan data, and the magnetic resonance image data are presented on a display monitor, with the magnetic resonance scan data being configured such that the magnetic resonance image data generated therefrom have an image quality sufficient for diagnostic evaluation. The magnetic resonance image data having an image quality sufficient for diagnostic evaluation means that the magnetic resonance image data have a clinically relevant contrast, for example. In this way it can be determined that the magnetic resonance image data are then of an image quality sufficient for diagnostic evaluation if at least one image quality parameter is greater than at least one minimum value. The at least one image quality parameter can be chosen, for example, from the following list: a signal-to-noise ratio (SNR) of the magnetic resonance image data, a contrast-to-noise ratio (CNR) of the magnetic resonance image data, a resolution of the magnetic resonance image data, freedom from artifacts of the magnetic resonance image data. A diagnostic magnetic resonance sequence is therefore preferably used for acquiring the magnetic resonance scan data. In this way the magnetic resonance scan data can be used to generate the attenuation map and to generate the magnetic resonance image data that is shown on the display monitor. The same magnetic resonance scan data are advantageously used to generate the attenuation map and to generate the magnetic resonance image data. This means that both the attenuation map and the magnetic resonance image data can be generated from a single set of information stored (entered) in k-space. According to the invention, the magnetic resonance scan data therefore fulfils a dual function. The magnetic resonance scan data acquired by execution of the diagnostic magnetic resonance sequence can be incorporated in the generation of the attenuation map in addition to, by execution of the dedicated magnetic resonance sequence, being suitable for dedicated generation of an attenuation map. Use of the dedicated magnetic resonance sequence can alternatively be omitted. Use of the magnetic resonance scan data acquired by the diagnostic magnetic resonance sequence for attenuation correction of the emission tomography scan data can have the advantage that the magnetic resonance scan data acquired in this way have fewer signal changes due to the magnetic interference field than magnetic resonance scan data acquired by execution of a dedicated magnetic resonance sequence, which is suitable for dedicated generation of an attenuation map. The diagnostic magnetic resonance sequence, which is used to acquire the magnetic resonance scan data, can in this way be purposefully designed for a reduction in metal artifacts.

In another embodiment, the magnetic resonance sequence has at least one of the following settings for sequence parameters: a value for an excitation bandwidth that is increased with respect to a standard value, a value for a readout bandwidth that is increased with respect to a standard value, a value for an echo time that is reduced with respect to a standard value, a value of a gradient field strength that is increased with respect to a standard value. The magnetic resonance sequence can have a very high value for the excitation bandwidth and/or a very high value for the readout bandwidth and/or a very low value for the echo time and/or a very high value for the gradient field strength. The very low echo time is very advantageous in particular when used in combination with a gradient echo sequence. For example, at 3 tesla, radio-frequency pulses with an excitation bandwidth of 4 kHz instead of a standard value of 1 kHz can be used. The radio-frequency pulses can also have a readout bandwidth of 700 Hz per pixel, instead of a standard value of 200 Hz per pixel.

In another embodiment, the magnetic resonance sequence has at least one of the following settings for sequence parameters: a maximum value for an excitation bandwidth possible for the magnetic resonance sequence, a maximum value for a readout bandwidth possible for the magnetic resonance sequence, a minimum value for an echo time possible for the magnetic resonance sequence, a maximum value of a gradient field strength possible for the magnetic resonance sequence. The respective maximum values can depend on the type of magnetic resonance device and/or magnetic resonance device of the combined magnetic resonance emission tomography device. The magnetic resonance sequence can have such settings of the sequence parameters and be chosen from the following group: FLASH 3D VIBE, DIXON MAVRIC, UTE MAVRIC, 3D TSE DIXON. The settings of the sequence parameters can be chosen separately from each other. For example, just one maximum possible value can be chosen for the excitation bandwidth, etc. It is of course also conceivable for any combinations of the settings of the sequence parameters to be chosen. The excitation bandwidth and the readout bandwidth can therefore be maximized, for example, at the same time, etc. The settings for the sequence parameters are especially well suited separately or in combination, such that the magnetic resonance sequence with the sequence parameters chosen in this way is designed to least partially compensate inference due to the magnetic interference field. The particularly short echo time and/or the maximization of the gradient field strength can therefore make it possible to acquire magnetic resonance signals from the interference object by execution of the magnetic resonance sequence. Maximization of the excitation bandwidth can lead to a reduction in a sensitivity of the magnetic resonance sequence to differences in susceptibility, in particular perpendicularly to a slice direction. Maximization of the readout bandwidth can lead to a reduction in a sensitivity of the magnetic resonance sequence to differences in susceptibility, in particular parallel to a slice direction.

In another embodiment, the magnetic resonance sequence includes multiple acquisitions using different carrier frequencies. An approach of this kind in the acquisition of magnetic resonance scan data is also known as the MAVRIC method (Multi Acquisition Variable Resonance Image Combination method). The MAVRIC method can be combined, for example, with a turbo spin echo magnetic resonance sequence or a UTE (ultrashort echo time) magnetic resonance sequence. The scan data recorded during the multiple acquisitions then jointly form the magnetic resonance scan data. The scan data recorded during the multiple acquisitions can be combined to form the magnetic resonance scan data, for example by means of a, possibly square, addition in an image region. An identical sequence pattern is repeatedly used for acquisition of the magnetic resonance scan data in the respective multiple acquisitions, with a different carrier frequency being used in each respective acquisition. A first carrier frequency is therefore used for a first acquisition of the multiple acquisitions and a second carrier frequency is used for a second acquisition of the multiple acquisitions, with the first carrier frequency and the second carrier frequency differing for each other. Of course the magnetic resonance scan data can also be acquired in more than two acquisitions. The number of acquisitions can be flexibly chosen. The number can be oriented toward a magnitude of a desired reduction in image artifacts present due to the interference object, for example the magnitude of signal changes and/or image distortions. The carrier frequency can be a resonance frequency and/or an excitation frequency and/or a reception frequency for the magnetic resonance imaging. A difference between two different carrier frequencies, which is used during different acquisitions of the multiple acquisitions, can match a bandwidth of an excitation pulse of the magnetic resonance sequence. In this way acquisition of the magnetic resonance scan data can include acquisition of resonant and non-resonant (off resonant) magnetic resonance scan data. In this way magnetic resonance signals can be acquired from a material that is located in the immediate vicinity of the interference object. One reason for this is that the magnetic interference field of the interference object typically leads to a change in the resonance frequency of protons in the immediate vicinity of the interference object. Signals, which emanate from these protons with the shifted resonance frequencies, can be acquired by the inventive use of multiple acquisitions with different carrier frequencies. The magnetic resonance scan data can represent information about a tissue in the immediate vicinity of the interference object. In this way a signal cancellation, caused by the interference object, can advantageously be reduced or completely avoided. The quality of the attenuation map generated from the magnetic resonance scan data thus can be increased therefore.

In another embodiment, the multiple acquisitions occur separately from each other with an acquisition pause between each acquisition, with the duration of a single acquisition of the multiple acquisitions having matched to the duration of breath-hold by the examination object. The acquisition pause then has a minimum length that allows the examination object to inhale, in particular deeply, during the acquisition pause. The repeated occurrence of the sequence pattern of the magnetic resonance sequence in the multiple acquisitions can lead to the duration of the magnetic resonance sequence being longer than the duration of a breath-hold of the examination object. A breath-hold of this kind can last at most for as long as the examination object can hold his or her breath when lying down. The duration of such a breath-hold will typically be between 10 and 40 seconds, for example 20 seconds. The matching duration of the individual acquisition to the duration of the breath-hold means that the duration of the individual acquisition is shorter or equal to the duration of the breath-hold. The apportioning of the multiple acquisitions among the multiple breath-holds makes it possible for the examination object to hold his or her breath during the individual acquisitions. In this way breathing artifacts can be avoided in the magnetic resonance scan data and the quality of the attenuation map generated from the magnetic resonance scan data is increased.

In another embodiment, the magnetic resonance sequence has sequence parameters such that a resolution of the magnetic resonance scan data in one slice is finer than $(1.5 \times 1.5)$ mm$^2$. In particular, the resolution in the slice is finer than $(1.2 \times 1.2)$ mm$^2$, preferably finer than $(0.8 \times 0.8)$ mm$^2$, most preferably finer than $(0.5 \times 0.5)$ mm$^2$. The resolution in one slice means an in-plane resolution. This choice of resolution is made in combination with a choice of suitable sequence parameters, such as, for example, a maximum readout and/or excitation bandwidth and/or a minimum echo time and/or a maximum gradient field strength. The higher resolution leads, in particular, to smaller voxels in the magnetic resonance scan data. In this way there can be smaller dephasings within the voxels of the magnetic resonance scan data due to the magnetic interference field of the interference object. Signal changes in the magnetic resonance scan data can in turn be reduced, and the quality of the attenuation map generated from the magnetic resonance scan data is increased in this way. At the same time the attenuation map can map finer structures, so the accuracy of the attenuation correction of the emission tomography scan data can be increased.

In another embodiment, first magnetic resonance scan data are acquired using a first magnetic resonance sequence and second magnetic resonance scan data are acquired using a second magnetic resonance sequence, and the attenuation map is generated using the first magnetic resonance scan data and the second magnetic resonance scan data. It is particularly advantageous in this connection for the generation of the attenuation map to be a generation of a provisional attenuation map using the first magnetic resonance scan data, and an adjustment of the provisional attenuation map using the second magnetic resonance scan data. The first magnetic resonance scan data and the second magnetic resonance scan data can alternatively be incorporated together in the generation of the attenuation map. The image contents of the first magnetic resonance scan data therefore can be combined with image contents of the second magnetic resonance scan data, with the combined image contents then being incorporated in the generation of the attenuation map. In general it is advantageous for the second magnetic resonance scan data to represent information about the interference object and/or a tissue, which surrounds the interference object, which is complementary and/or supplementary to the first magnetic resonance scan data. For this purpose, for example, the second magnetic resonance scan data can have a higher resolution than the first magnetic resonance scan data, as described in the following. The second magnetic resonance scan data can purposefully map the interference object. Alternatively, the first magnetic resonance scan data can cover a greater body region than the second magnetic resonance scan data and therefore represent information about an attenuation of the emission tomography scan data from the larger body region. In particular, the first magnetic resonance sequence is designed differently from the second magnetic resonance sequence, for example, with respect to the type of magnetic resonance sequence and/or with respect to sequence parameters therefore used. A magnetic resonance sequence of the type that is conventionally used to create the attenuation map can be executed to acquire the first magnetic resonance scan data. A magnetic resonance sequence that has been specifically optimized for imaging in the vicinity of the interference object is advantageously used to acquire the second magnetic resonance scan data. The first magnetic resonance scan data and the second magnetic resonance scan data are acquired separately from each other in two mutually disjunct recording processes. The second magnetic resonance scan data can supply additional information that goes beyond the first magnetic resonance scan data, so that the attenuation map adjusted by the second magnetic resonance scan data has more accurate information with respect to attenuation in a spatial environment of the interference object than the provisional attenuation map. For example, the adjusted attenuation map can have fewer signal changes than the provisional attenuation map. In this way attenuation correction of the emission tomography scan data can be made using the attenuation map adjusted in this way.

In another embodiment, the first magnetic resonance sequence and the second magnetic resonance sequence have sequence parameters such that a resolution of the second magnetic resonance scan data is finer in at least one direction than a resolution of the first magnetic resonance scan data. In this way, the spatial environment of the interference object can be mapped in the second magnetic resonance scan data with a finer resolution than in the first magnetic resonance scan data. The resolution of the second magnetic resonance scan data being finer than the resolution of the first magnetic resonance scan data means that the resolution of the second magnetic resonance scan data is higher than the resolution of the first magnetic resonance scan data, or that at least one edge length of voxels of the second magnetic resonance scan data is shorter than the corresponding edge length of voxels of the first magnetic resonance scan data. As described immediately below, an examination region of the second magnetic resonance scan data, which is mapped with a finer resolution, is smaller than an examination region of the first magnetic resonance scan data. By using the finer resolution, the second magnetic resonance scan data can map the region around the interference object in order to generate the attenuation map. For example, a reduction in artifacts in the second magnetic resonance scan data, in particular specifically for a spatial environment of the interference object, can be attained in this way compared to the first magnetic resonance scan data.

In another embodiment, the first magnetic resonance sequence has a first recording volume and the second magnetic resonance sequence a second recording volume, wherein the second recording volume is a sub-volume of the first recording volume and the second recording volume contains at least that section of the examination region in which the interference object is localized. The second recording volume thus is smaller than the first recording volume. Furthermore, the second recording volume is completely contained in the first recording volume. The second recording volume is preferably repeatedly recorded both in the acquisition of the first magnetic resonance scan data and in the acquisition of the second magnetic resonance scan data, in particular with higher resolution. The second recording volume can specifically map the section of the examination region in which the interference object is localized. The first recording volume can map a larger body region of the examination region and potentially be a whole body scan. Use of a smaller recording volume for recording the second magnetic resonance scan data can lead to a shorter recording time of the second magnetic resonance sequence. In this way it is possible, for example, to record the second magnetic resonance scan data during a single breath-hold of the examination object. In this way, the recording time can be shortened and/or breathing artifacts in the second magnetic resonance scan data can be reduced. At the same time the second magnetic resonance scan data can map the spatial region around the interference object specifically for generation of the attenuation map.

In another embodiment, the magnetic resonance sequence is at least one of the magnetic resonance sequences from the following first group: FLASH 3D VIBE, DIXON MAVRIC, UTE MAVRIC, 3D TSE DIXON. In particular, one of the magnetic resonance sequences from the first group can be used to record the magnetic resonance scan data. The described MAVRIC method is particularly advantageously suitable in combination with a FLASH or UTE (ultrashort echo time scan) for a reduction in artifacts due to the magnetic interference field that is caused by the interference object. The MAVRIC method can be combined particularly advantageously with magnetic resonance sequences used as standard for the generation of the attenuation map, such as, for example, the FLASH 3D VIBE or UTE sequence. A combination of the MAVRIC method with non-selective, possibly clinical, sequences, in which a volume is excited, is advantageous. The magnetic resonance scan data recorded by the 3D TSE DIXON sequence can also be reconstructed to form magnetic resonance image data having an image quality sufficient for diagnostic evaluation. In this way the magnetic resonance scan data recorded by means of the 3D TSE DIXON can advantageously fulfill a dual role. It can simultaneously be used for the generation of the attenuation map and for the generation of diagnostic magnetic resonance image data. The setting for sequence parameters, for example a maximum excitation bandwidth and/or maximum readout bandwidth and/or a minimum echo time and/or a maximum gradient field strength as described above is used for the described sequences. In this way magnetic resonance scan data can be acquired particularly advantageously for generation of the attenuation map by the described magnetic resonance sequences.

In another embodiment, the magnetic resonance sequence is at least one of the magnetic resonance sequences from the following second group: TSE, TSE VAT, SEMAC, MAVRIC. In particular, one of the magnetic resonance sequences from the second group can be used for recording the magnetic resonance scan data. The SEMAC (Slice Encoding for Metal Artifact Correction) method provides similar advantages to the MAVRIC method already mentioned. Furthermore, a combination of the SEMAC method in particular with selective, possibly clinical, sequences, in which individual slices are excited, is advantageous. The same applies to the use of the VAT (view angle tilting) method. The magnetic resonance scan data acquired by means of the magnetic resonance sequences have an especially high reduction of artifacts due to the interference object and can reproduce a material and/or a form of the interference object particularly clearly therefore. For example, a signal cancellation due to the magnetic interference field can be particularly advantageously reduced when the magnetic resonance sequences are used. At the same time a distortion of image contents of the magnetic resonance scan data, in particular in a spatial environment of the interference object, can be particularly advantageously corrected by the magnetic resonance sequences, in particular the VAT, SEMAC or MAVRIC method.

In another embodiment, the magnetic resonance sequence is a UTE-MAVRIC sequence. The combination of imaging with ultrashort echo times and the MAVRIC method has proven to be particularly advantageous for the reduction of signal changes due to the magnetic interference field and in this way for imaging in the surroundings of the interference object.

In another embodiment, the first magnetic resonance sequence is chosen from the first group and the second magnetic resonance sequence from the second group. In this way, for example, first magnetic resonance scan data can be acquired by execution of one of the magnetic resonance sequences of the first group and by execution of one of the magnetic resonance sequences from the second group second magnetic resonance scan data. The second magnetic resonance scan data can be recorded from a smaller recording volume than the first magnetic resonance scan data. At the same time the second magnetic resonance scan data can have a higher resolution than the first magnetic resonance scan data. For example, the second magnetic resonance scan data can be used to correct signal changes due to the magnetic interference field, which occur in the first magnetic resonance scan data. The second magnetic resonance scan data acquired in this way can therefore provide additional information valuable to the first magnetic resonance scan data for generation of the attenuation map, which information is selectively specific for a spatial environment of the interference object. For example, as described below, an attenuation value can be chosen on the basis of the second magnetic resonance scan data when generating the attenuation map. For example, a difference in a signal cancellation due to the magnetic interference field can be determined between the first magnetic resonance scan data and the second magnetic resonance scan data. A region in the attenuation map can then be determined on the basis of this determined difference, and this can then be provided with a suitable attenuation value, for example an attenuation value of tissue and/or metal. This is one example of how the second magnetic resonance scan data recorded in this way can be incorporated in the generation of the attenuation map in combination with the first magnetic resonance scan data.

In another embodiment, interference object information is generated using the magnetic resonance scan data, wherein the interference object information includes at least one item of information about a material of the interference object, and the attenuation map is generated by taking into account the interference object information.

In this way the interference object can be segmented, for example on the basis of the magnetic resonance scan data. The interference object information can then designate a geometry and/or a form of the interference object. The segmented interference object can then be filled with a suitable linear attenuation coefficient during generation of the attenuation map.

The geometry of the interference object can be taken into account, for example, by filling various parts of the interference object with different linear attenuation coefficients during generation of the attenuation map. For example, hip implants frequently comprise a titanium shaft, wherein tissue surrounding the titanium shaft is barely affected by signal cancellation, and a head made from CoCr, which causes a high signal cancellation in tissue located around the head. Accordingly, during generation of the attenuation map these two parts of the hip implant can be considered separately when determining the metal/tissue content in the signal cancellation portion. For this purpose, the interference object information can be, for example, information about a localization and/or geometry of the titanium shafts and of the head of the hip joint.

Specific prior knowledge about the interference object and/or the used magnetic resonance sequence can be used in this context. This approach is based on the consideration that a signal cancellation and/or a distortion in the magnetic resonance scan data typically depends greatly on a material and/or a form and/or orientation of the interference object and/or a chosen magnetic resonance sequence for recording the magnetic resonance scan data. In this way, for example, the strength of the signal cancellation due to the magnetic interference field can be estimated. For example, a CoCr as the material of the interference object causes stronger signal cancellations than titanium. For example, the use of SEMAC with 20 coding steps as the magnetic resonance sequence corrects distortions better than the use of SEMAC with 12 coding steps. Accordingly, the content of the metal/tissue in the entire remaining signal cancellation portion can be estimated during generation of the attenuation map.

For generation of the attenuation map, a region of a signal cancellation in the magnetic resonance scan data can be filled with an attenuation value of the material of the interference object, for example metal. The type of metal and/or the attenuation value can be manually specified by a user. It is also conceivable for just one attenuation coefficient of tissue to be used to fill the signal cancellation, in particular if the material of the interference object is not known. This is an improvement since a signal cancellation due to the magnetic interference field typically extends beyond the actual interference object into the surrounding tissue. The region of the signal cancellation can be filled from the outside to the inside with the estimated tissue content. This filling can occur homogeneously or irregularly, in particular in accordance with the interference object information. The tissue content in the signal cancellation can be estimated on the basis of the magnetic resonance scan data, such as on the basis of a magnitude of a deviation of magnetic resonance signals from a resonance frequency in the magnetic resonance scan data and/or on the basis of known properties of the magnetic resonance sequence that are used to acquire the magnetic resonance sequence.

By one of the described approaches, a signal resolution, caused by the interference object, in the magnetic resonance scan data can be particularly advantageously filled with a linear attenuation coefficient, which is ascertained on the basis of the interference object information, for generation of the attenuation map. Of course further possibilities, which are considered expedient to those skilled in the art, for reducing the signal cancellation are also possible for generation of the attenuation map.

The inventive combined magnetic resonance emission tomography apparatus has a magnetic resonance data acquisition scanner, an emission tomography data acquisition scanner physically embodied with the magnetic resonance scanner and a computer that includes an attenuation map generating processor and an attenuation correction processor, wherein the combined magnetic resonance emission tomography device is designed to implement the inventive method described above.

The combined magnetic resonance emission tomography apparatus is therefore designed to carry out a method for attenuation correction of emission tomography scan data for combined magnetic resonance emission tomography imaging of an examination object in an examination region, wherein positioned in the examination region is an interference object which causes a magnetic interference field during combined magnetic resonance emission tomography imaging.

The magnetic resonance data acquisition scanner is designed to acquire magnetic resonance scan data of the examination object, by executing a magnetic resonance sequence designed to at least partially compensate interference due to the magnetic interference field. The emission tomography data acquisition scanner is designed to acquire emission tomography scan data of the examination object. The attenuation map generating processor is designed to generate an attenuation map using the acquired magnetic resonance scan data. The attenuation correction processor is designed for attenuation correction of the emission tomography scan data using the generated attenuation map.

A non-transitory, computer-readable data storage medium in accordance with the invention can be loaded directly into a memory of a programmable computer of a combined magnetic resonance emission tomography apparatus and is encoded with program code that cause the computer to execute an inventive method when the program code is executed in the computer of the combined magnetic resonance emission tomography device. The inventive method can consequently be carried out quickly and robustly and in a manner that can be identically repeated. The computer must have the components such as an appropriate main memory, an appropriate graphics card or an appropriate logic unit, so the respective method steps can be carried out efficiently.

Examples of electronically readable data carriers are a DVD, magnetic tape or a USB stick, on which electronically readable control information, in particular software (cf. above), is stored.

The advantages of the inventive combined magnetic resonance emission tomography device substantially match the advantages of the inventive method which have been described above in detail. Features, advantages or alternative forms of embodiment mentioned in this context are applicable to the other aspects of the invention. The corresponding functional features of the method are formed by appropriate physical modules, in particular by hardware modules.

DESCRIPTION OF THE PREFERRED EMBODIMENTS

Figure 1:
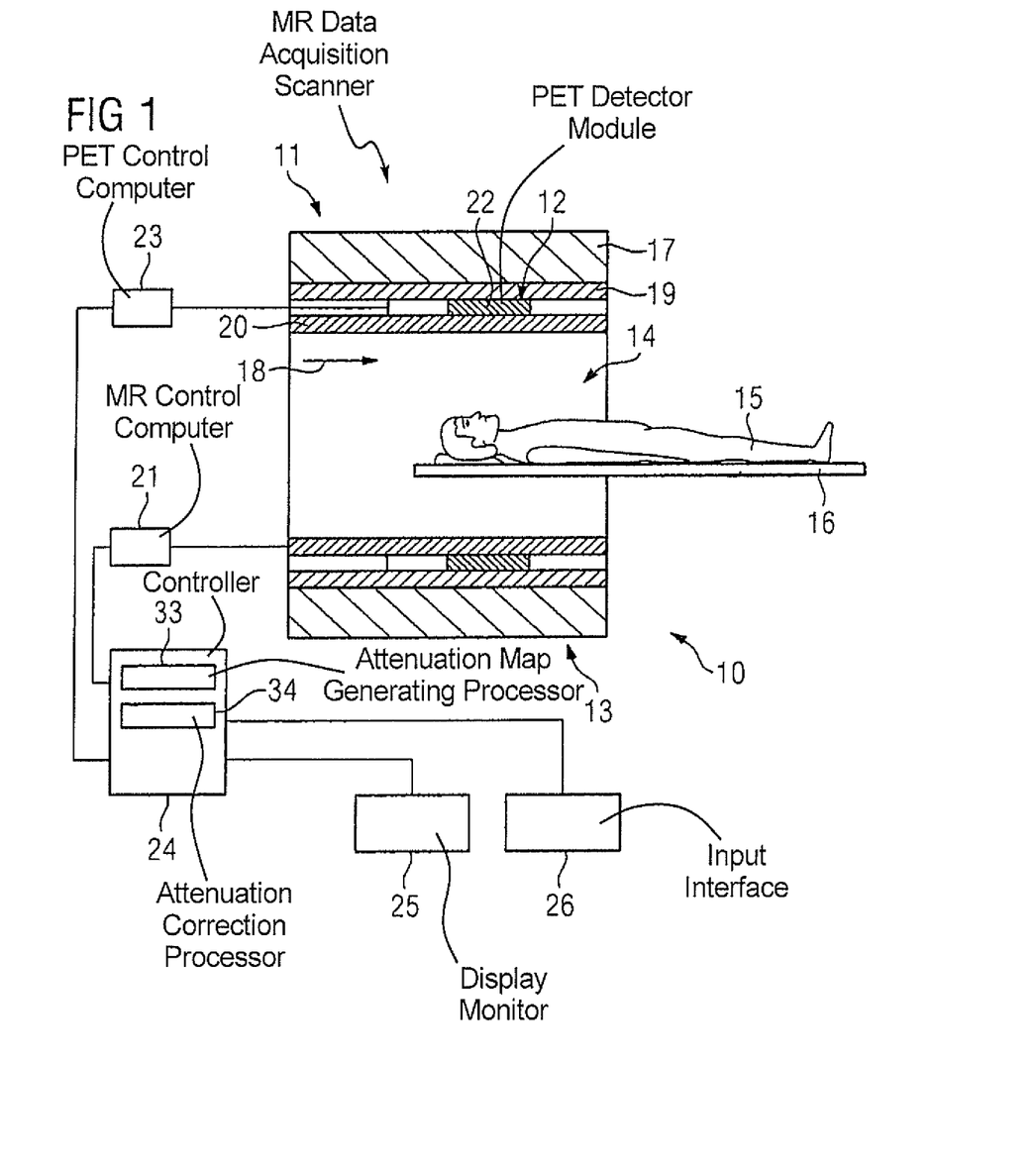
FIG. 1 shows an inventive combined magnetic resonance emission tomography device in a schematic illustration.

FIG. 1 shows an inventive combined magnetic resonance emission tomography apparatus in a schematic illustration. The illustrated magnetic resonance emission tomography apparatus is designed, as an example, as a magnetic resonance positron emission tomography apparatus (magnetic resonance PET apparatus) 10. The magnetic resonance PET apparatus 10 has a magnetic resonance data acquisition scanner 11. The magnetic resonance PET apparatus 10 also has a positron emission tomography data acquisition scanner (PET scan data acquisition scanner) 12. Alternatively it is also conceivable for the magnetic resonance emission tomography apparatus to be designed as a magnetic resonance single photon emission tomography apparatus (magnetic resonance SPECT apparatus). The magnetic resonance SPECT apparatus will then have a single photon emission tomography data acquisition scanner (SPECT scan data acquisition scanner) instead of the PET data acquisition scanner 12.

The magnetic resonance data acquisition scanner 11 has a magnet unit 13 and a patient-receiving region 14 surrounded by the magnet unit 13, for receiving an examination object 15, in particular a patient 15. The patient-receiving region 14 is cylindrically surrounded in a circumferential direction by the magnet unit 13 in this embodiment. The patient 15 can be moved by a patient positioning device 16 of the magnetic resonance PET apparatus 10 into the patient-receiving region 14. The patient positioning device 16 is for this purpose arranged so as to move inside the patient-receiving region 14.

The magnet unit 13 has a basic field magnet 17 which, during operation of the magnetic resonance data acquisition scanner 11, is designed to generate a strong and constant basic magnetic field 18. The magnet unit 13 also has a gradient coil arrangement 19 for generating magnetic field gradients that are used for spatially encoding the magnetic resonance signals during imaging. The magnet unit 13 also has a radio-frequency antenna arrangement 20, which in the illustrated case is designed as a body coil permanently integrated in the magnetic resonance data acquisition scanner 11. The radio-frequency antenna arrangement 20 is operated to excite nuclear spin so as to deviate from the polarization that is established in the basic magnetic field 18 generated by the basic field magnet 17. The radio-frequency antenna arrangement 20 is also designed to receive magnetic resonance signals.

To control the basic field magnet 17, the gradient coil arrangement 19, and the radio-frequency antenna arrangement 20, the magnetic resonance PET apparatus 10, in particular the magnetic resonance data acquisition scanner 11, has a magnetic resonance control computer 21. The magnetic resonance control computer 21 centrally controls the magnetic resonance device 11, for example, to execute a predetermined imaging gradient echo sequence. For this purpose, the magnetic resonance control computer 21 has a gradient control unit (not shown) and a radio-frequency antenna control unit (not shown). Furthermore, the magnetic resonance control computer 21 has an evaluation unit (not shown) for an evaluation of magnetic resonance image data.

The illustrated magnetic resonance data acquisition scanner 11 can of course have further component that magnetic resonance data acquisition scanners conventionally have. The general mode of operation of a magnetic resonance data acquisition scanner is known to those skilled in the art, so that a detailed description of the general components is not necessary herein.

The PET data acquisition scanner 12 has a number of positron emission tomography detector modules (PET detector modules) 22 that are arranged in an annulus surrounding the patient-receiving region 14 in the circumferential direction. The PET detector modules 22 each have a number of positron emission tomography detector elements (PET detector elements) (not shown), which are arranged to form a PET detector array, which includes a scintillation detector array having scintillation crystals, for example LSO crystals. The PET detector modules 22 also each include a photodiode array, for example an avalanche photodiode array (APD array), which are arranged inside the PET detector modules 22 so as to be connected downstream of the scintillation detector array.

Photon pairs, which result from the annihilation of a positron by an electron, are detected by the PET detector modules 22. The respective trajectories of the two photons form an angle of 180°. The two photons each have energy of 511 keV. The positron is emitted by a radiopharmaceutical, with the radiopharmaceutical being administered to the patient 15 by an injection. While passing through matter, the photons produced during annihilation can be attenuated, with the attenuation probability depending on the path length through the matter and the corresponding attenuation coefficient of the matter. A correction of these signals with respect to the attenuation by components that are located in the beam path, is therefore necessary in the evaluation of the PET signals.

The PET detector modules 22 also each have an electronic detector that includes an electric amplifier circuit and further electronic components (not shown). To control the electronic detector and the PET detector modules 22, the magnetic resonance PET apparatus 10, in particular the PET data acquisition scanner 12, has a PET control computer 23. The PET control computer 23 centrally controls the PET data acquisition scanner 12. The PET control computer 23 also has an evaluation unit for evaluation of PET data.

The illustrated PET data acquisition scanner 12 can of course have further components that PET data acquisition scanners conventionally have. The general mode of operation of a PET data acquisition scanner is known to those skilled in the art, so that a detailed description of the general components is not necessary herein.

The magnetic resonance PET apparatus 10 has a central controller (computer) 24 which coordinates, for example, acquisition and/or evaluation of magnetic resonance scan data and PET scan data. The controller 24 can be a central system control unit. Control information, such as imaging parameters, and reconstructed image data can be displayed for a user on a display monitor 25, for example on at least one screen, of the magnetic resonance PET apparatus 10. Furthermore, the magnetic resonance PET apparatus 10 has an input interface 26 via which a user can enter information and/or parameters during a scanning process. The controller 24 can include the magnetic resonance control computer 21 and/or the PET control computer 23.

The controller 24 also has a magnetic resonance attenuation map generating processor 33 and an attenuation correction processor 34.

In this way the illustrated magnetic resonance PET apparatus 10 is designed for attenuation correction of emission tomography scan data.

Figure 2:
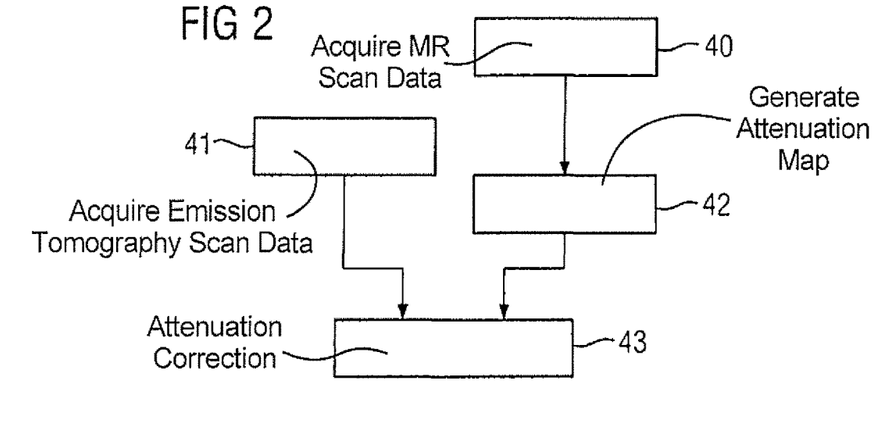
FIG. 2 is a flowchart of a first embodiment of an inventive method.

FIG. 2 shows a flowchart of a first embodiment of an inventive method for attenuation correction of emission tomography scan data.

In a first method step 40 magnetic resonance scan data of the examination object are acquired by means of the magnetic resonance scan data acquisition scanner 11, wherein a magnetic resonance sequence, which is designed to at least partially compensate interference due to the magnetic interference field, is used to acquire the magnetic resonance scan data. The magnetic resonance sequence defines a sequence of control commands with which the magnetic resonance scan data acquisition scanner 11 acquires the magnetic resonance scan data.

In a further method step 41, emission tomography scan data of the examination object are acquired by means of the emission tomography scan data acquisition scanner 12. A simultaneous magnetic resonance emission tomography examination of the examination object 15 can be implemented by the magnetic resonance emission tomography apparatus 10. During this simultaneous magnetic resonance emission tomography examination, the magnetic resonance scan data are acquired at least partially simultaneously in a further method step 40 and the emission tomography scan data are acquired in a further method step 41. The magnetic resonance scan data and the emission tomography scan data are acquired from the same examination object 15.

In a further method step 42 an attenuation map is generated by the attenuation map generating processor 33 using the acquired magnetic resonance scan data.

In a further method step 43 an attenuation correction of the emission tomography scan data is made by the attenuation correction processor 34 using the generated attenuation map. Emission tomography image data can be reconstructed from the emission tomography scan data by the attenuation correction. The emission tomography image data can then be omitted as a data file, such as in the form of an image on the display monitor 25 or for storage in a database. The emission tomography image data can be displayed on the display monitor 25 so as to be merged with magnetic resonance image data which are generated on the basis of the magnetic resonance scan data.

Figure 3:
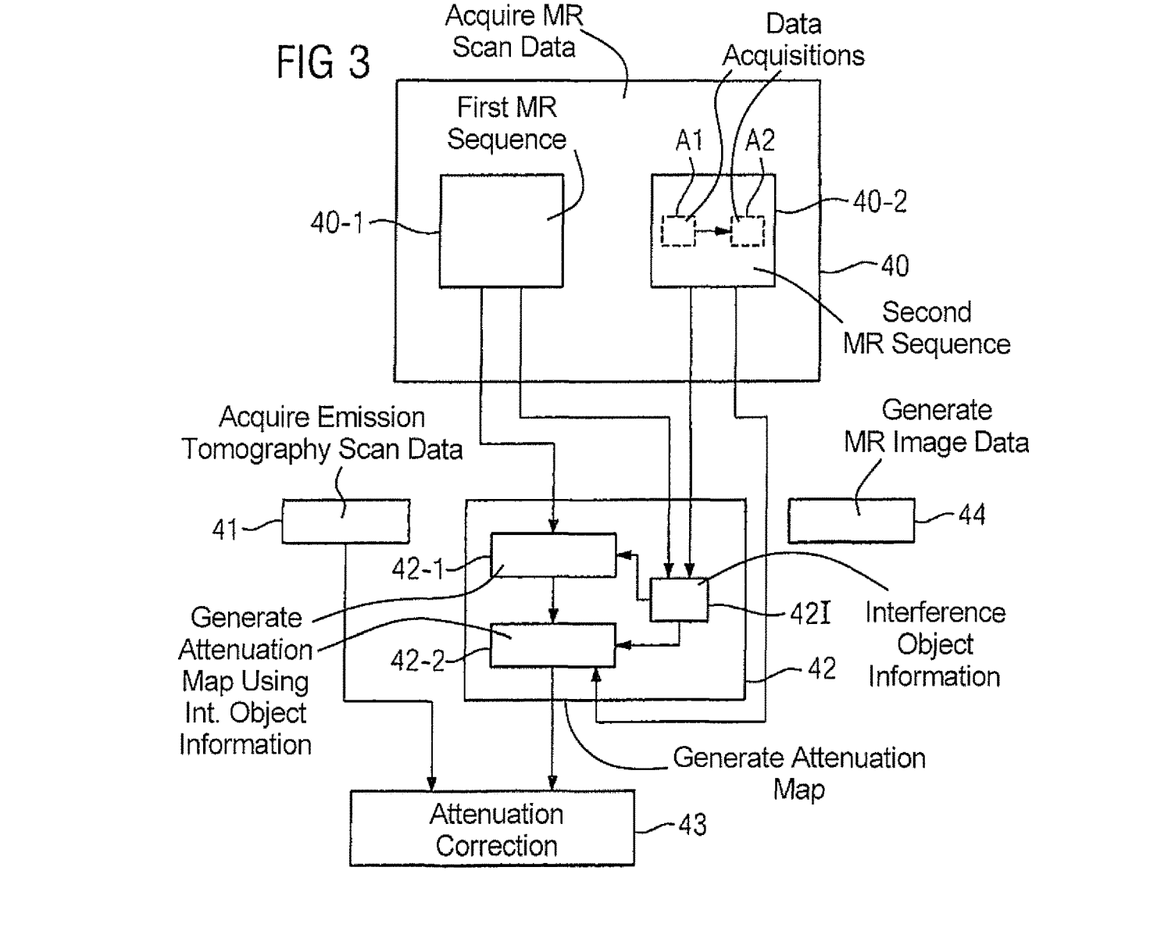
FIG. 3 is a flowchart of a second embodiment of an inventive method.

FIG. 3 shows a flowchart of a second embodiment of an inventive method for attenuation correction of emission tomography scan data.

The following description is essentially limited to the differences from the exemplary embodiment in FIG. 2, with reference being made in respect of unchanging method steps to the description of the exemplary embodiment in FIG. 2. Method steps that are essentially unchanging are basically numbered with the same reference characters.

The second embodiment of the inventive method shown in FIG. 3 includes method steps 40, 41, 42, 43 of the first embodiment of the inventive method according to FIG. 2. In addition, the second embodiment of the inventive method shown in FIG. 3 has additional method steps and substeps. A method sequence alternative to FIG. 3, which has only some of the additional method steps and/or substeps in FIG. 2, is also conceivable. Of course a method sequence alternative to FIG. 3 can also have additional method steps and/or substeps.

In the illustrated case acquisition of the magnetic resonance scan data in method step 40 includes acquisition of first magnetic resonance scan data using a first magnetic resonance sequence 40-1 and acquisition of second magnetic resonance scan data using a second magnetic resonance sequence 40-2.

The first magnetic resonance sequence and the second magnetic resonance sequence advantageously have sequence parameters such that a resolution of the second magnetic resonance scan data is finer in at least one spatial direction than a resolution of the first magnetic resonance scan data. Furthermore, the first magnetic resonance sequence advantageously has a first recording volume and the second magnetic resonance sequence a second recording volume, wherein the second recording volume is a subvolume of the first recording volume and the second recording volume contains at least that section of the examination region in which the interference object is localized.

Figure 4:
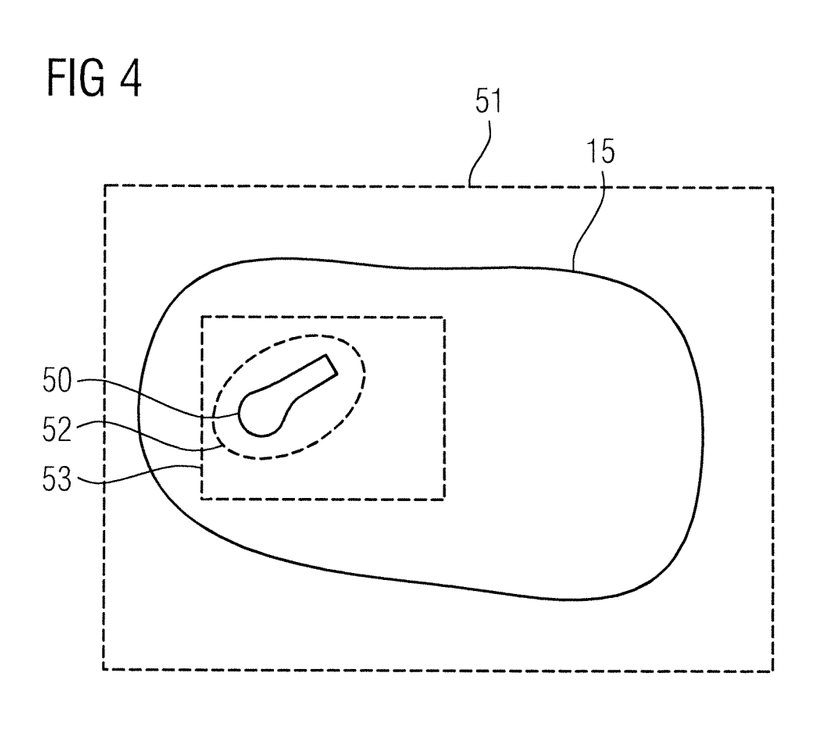
FIG. 4 shows an exemplary embodiment for setting recording volumes of first and second magnetic resonance sequences.

FIG. 4 shows an exemplary embodiment for setting recording volumes of first and second magnetic resonance sequences. FIG. 4 shows an axial slice of the examination object 15 in which an interference object 50 is positioned. During combined magnetic resonance emission tomography imaging the interference object 50 causes a magnetic interference field which causes a signal cancellation 52 in a spatial environment of the interference object 50 in the magnetic resonance scan data recorded by the first magnetic resonance sequence. The first magnetic resonance sequence has a first recording volume 51 which is the entire axial slice, in particular at a low resolution. The second magnetic resonance sequence comprises a second recording volume 53 which purposefully maps the interference object and/or the signal resolution 52, in particular at a high resolution. The second recording volume 53 is a section of the first recording volume 51. In the second magnetic resonance scan data recorded by means of the second magnetic resonance sequence the signal cancellation can then be reduced with respect to the first magnetic resonance scan data owing to the appropriate choice of magnetic resonance sequence and/or sequence parameters.

The magnetic resonance sequence, in particular the first magnetic resonance sequence and/or the second magnetic resonance sequence, be at least one of the magnetic resonance sequences from the following first group: FLASH 3D VIBE, DIXON MAVRIC, UTE MAVRIC, 3D TSE DIXON. The magnetic resonance sequence, in particular the first magnetic resonance sequence and/or the second magnetic resonance sequence, can also be at least one of the magnetic resonance sequences from the following second group: TSE, TSE VAT, SEMAC, MAVRIC. The magnetic resonance sequence particularly preferably is a UTE MAVRIC sequence. The first magnetic resonance sequence is advantageously chosen from the first group and the second magnetic resonance sequence from the second group.

The magnetic resonance sequence, in particular the first magnetic resonance sequence and/or the second magnetic resonance sequence, can have sequence parameters such that a resolution of the magnetic resonance scan data in a slice is finer than (1.5×1.5) mm2. The magnetic resonance sequence, in particular the first magnetic resonance sequence and/or the second magnetic resonance sequence, can also have at least one of the following settings for sequence parameters:

a value for an excitation bandwidth that is increased with respect to a standard value, a value for a readout bandwidth that is increased with respect to a standard value, a value for an echo time that is reduced with respect to a standard value, a value of a gradient field strength that is increased with respect to a standard value.

The magnetic resonance sequence, in particular the first magnetic resonance sequence and/or the second magnetic resonance sequence, preferably comprise(s) at least one of the following settings for sequence parameters:

a maximum value for an excitation bandwidth possible for the magnetic resonance sequence, a maximum value for a readout bandwidth possible for the magnetic resonance sequence, a minimum value for an echo time possible for the magnetic resonance sequence, a maximum value of a gradient field strength possible for the magnetic resonance sequence.

Some examples of possible magnetic resonance sequences, in particular for possible first magnetic resonance sequences or second magnetic resonance sequences, are listed below. Of course, those skilled in the art, in particular starting from these examples, can make an appropriate choice for the magnetic resonance sequence to acquire the magnetic resonance scan data:

FLASH 3D VIBE DIXON or UTE, in particular having a maximum excitation bandwidth and/or a maximum readout bandwidth and/or a minimum echo time. A high resolution is also advantageously used for these sequences, for example of 0.5×0.5 mm$^2$, in one slice direction.

FLASH 3D VIBE DIXON MAVRIC or UTE MAVRIC. A different 3D GRE sequence can also form the basis of the MAVRIC method. A maximum excitation bandwidth and/or a maximum readout bandwidth and/or a minimum echo time can be used here too. A high resolution is again used, for example of 0.5×0.5 mm$^2$, in one slice direction for these sequences. As shown in substep 40-2 of FIG. 3, for these sequences the sequence is advantageously repeated at different carrier frequencies in addition to being carried out for an acquisition.

3D TSE DIXON, in particular having a maximum excitation bandwidth and/or maximum gradient field strengths. This sequence is also advantageously used at a high resolution, for example of 0.5×0.5 mm2, to reduce signal cancellations. A sequence of this kind is particularly suitable, for example owing to the reduced susceptibility artifacts, for the reconstruction of diagnostic magnetic resonance image data, as shown in method step 44 of FIG. 3.

magnetic resonance sequences having a minimum distortion due to metal, for example a high-resolution TSE or TSE VAT, a SEMAC sequence or a MAVRIC sequence.

In the illustrated case the second magnetic resonance sequence has two acquisitions A1, A2 using different carrier frequencies. The second magnetic resonance sequence can also have more than two acquisitions A1, A2. This is also conceivable for the first magnetic resonance sequence. The multiple acquisitions A1, A2 can occur separately from each other with an acquisition pause between the plurality of acquisitions A1, A2, with a duration of a single acquisition of the plurality of acquisitions A1, A2 advantageously being matched to a duration of a breath-hold of the examination object 15.

The attenuation map is generated in further method step 42 using the first magnetic resonance scan data and second magnetic resonance scan data. For example, in a first substep 42-1 of the further method step 42 a provisional attenuation map is generated using the first magnetic resonance scan data. In a second substep 42-2 of the further method step 42 the provisional attenuation map is adjusted using the second magnetic resonance scan data.

Generation of the attenuation map can include that interference object information is generated in a substep 421 of the further method step 42 using the magnetic resonance scan data, with the interference object information comprising at least one item of information about a material of the interference object. The attenuation map can then be generated in substep 42-1 and/or substep 42-2 by taking into account the interference object information. For generation of the attenuation map in further method step 42 a signal resolution in the magnetic resonance scan data caused by the interference object can be filed with a linear attenuation coefficient which is ascertained on the basis of the interference object information.

In a further method step 44 magnetic resonance image data is generated from the magnetic resonance scan data acquired in further method step 40. The magnetic resonance image data can then be presented as an output on a display monitor, in particular so as to be merged with the emission tomography image data. The magnetic resonance scan data are configured such that the magnetic resonance image data generated from the magnetic resonance scan data have an image quality sufficient for diagnostic evaluation. The attenuation map is advantageously generated in further method step 42, as shown in FIG. 3, on the basis of the same magnetic resonance scan data that is also used for the reconstruction of the magnetic resonance image data. The magnetic resonance scan data acquired by execution of the at least one magnetic resonance sequence therefore can firstly be used for the reconstruction of the magnetic resonance image data and secondly for the generation of the attenuation map. The magnetic resonance image data which form the basis of the magnetic resonance scan data that were used for generation of the attenuation map are emitted as an output.

The method steps of the inventive method shown in FIGS. 2 to 3 are carried out by the controller. For this purpose, the controller 24 has the requisite software and/or computer programs that are stored a memory of the controller 24. The software and/or computer programs include program code configured to cause the inventive method to be implemented when the program code runs in the controller 24 or a processor thereof.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for attenuation correction of emission tomography scan data acquired from a combined magnetic resonance emission tomography scanner, comprising:

operating a combined magnetic resonance emission tomography scanner as a magnetic resonance scanner while an examination object is situated in an examination region of the combined magnetic resonance emission tomography scanner, and while an interference object is present in the examination region that produces a magnetic interference field, so as to execute a magnetic resonance data acquisition sequence in order to acquire magnetic resonance scan data from the examination object, with at least some of said magnetic resonance data being perturbed by magnetic interference produced by said magnetic interference field;

operating said combined magnetic resonance emission tomography scanner as an emission tomography scanner to acquire emission tomography scan data from the examination object situated in the examination region of the combined magnetic resonance emission tomography scanner, by detecting events produced by a radioactive substance in said examination object, said events proceeding through tissue in the examination subject before detection thereof;

providing the acquired magnetic resonance scan data and the acquired emission tomography scan data to a computer;

in said computer, using the acquired magnetic resonance scan data to generate an interference-mitigated attenuation map of said tissue in which an effect of said magnetic interference caused by said interference object is mitigated by one of:

(a) operating said combined magnetic resonance emission tomography scanner to acquire said magnetic resonance scan data from the examination object, by acquiring first magnetic resonance scan data from the examination object by executing a first magnetic resonance data acquisition sequence, and by acquiring second magnetic resonance data from the examination object by executing a second magnetic resonance data acquisition sequence, generating a provisional attenuation map using said first magnetic resonance scan data, and adjusting said provisional attenuation map using said second magnetic resonance scan data, thereby generating an adjusted attenuation map as said interference-mitigated attenuation map, or (b) generating interference object information using said magnetic resonance scan data, said interference object information representing at least one characteristic of a material of said interference object, and generating said interference-mitigated attenuation map by filling signal cancellations in said magnetic resonance scan data, caused by said interference object, with a linear attenuation coefficient that is derived from said interference object information;

in said computer, using said attenuation map in an algorithm that is executed for attenuation correction of the emission tomography scan data, so as to produce attenuation corrected emission tomography scan data in which said effect of said magnetic interference caused by said interference object is also mitigated; and making the attenuation corrected emission tomography scan data available in electronic form as a data file from said computer.

2. A method as claimed in claim 1 comprising:

in said computer, generating, from said magnetic resonance scan data, magnetic resonance image data having an image quality that allows a diagnostic evaluation to be made from said magnetic resonance image data; and presenting said magnetic resonance image data at a display monitor in communication with said computer.

3. A method as claimed in claim 1 wherein said magnetic resonance data acquisition sequence comprises a plurality of sequence parameters, and providing settings for respective sequence parameters selected from the group consisting of a setting value for an excitation bandwidth that is increased with respect to a standard excitation bandwidth value, a setting value for a readout bandwidth that is increased with respect to a standard readout bandwidth value, a setting value for an echo time that is reduced with respect to a standard echo time value, and a value of a gradient field strength that is increased with respect to a standard gradient field strength value.

4. A method as claimed in claim 1 wherein said magnetic resonance data acquisition sequence comprises a plurality of sequence parameters, and comprising formulating settings for respective sequence parameters selected from the group consisting of a maximum value for an excitation bandwidth that is possible within said magnetic resonance sequence, a maximum value for a readout bandwidth that is possible within said magnetic resonance sequence, a minimum value for an echo time that is possible within said magnetic resonance sequence, and a maximum value of a gradient field strength that is possible within said magnetic resonance sequence.

5. A method as claimed in claim 1 comprising operating said combined magnetic resonance emission tomography scanner as said magnetic resonance scanner with said magnetic resonance data acquisition sequence comprising a plurality of acquisitions of said magnetic resonance scan data respectively using different carrier frequencies.

6. A method as claimed in claim 5 comprising operating said combined magnetic resonance emission tomography scanner as said magnetic resonance scanner to implement said plurality of acquisitions in said magnetic resonance data acquisition sequence separately from each other with an acquisition pause between successive acquisitions in said plurality of acquisitions, and with a duration of each individual acquisition in said plurality of acquisitions being matched to a duration of a breath hold of said examination object.

7. A method as claimed in claim 1 comprising operating said combined magnetic resonance emission tomography scanner as said magnetic resonance scanner by executing said magnetic resonance data acquisition sequence with sequence parameters that give said magnetic resonance scan data in a slice of said examination object a resolution that is finer than 1.5×1.5 mm2.

8. A method as claimed in claim 1 comprising generating the interference mitigation attenuation map using (a) and, in (a):

configuring said first magnetic resonance sequence with first sequence parameters and configuring said second magnetic resonance sequence with second sequence parameters, with said first sequence parameters and said second sequence parameters differing so as to give said second magnetic resonance scan data a resolution that is finer in at least one spatial direction than a resolution of said first magnetic resonance scan data.

9. A method as claimed in claim 1 comprising generating the interference mitigation attenuation map using (a) and, in (a):

acquiring said first magnetic resonance scan data with said first magnetic resonance data acquisition sequence in a first acquisition volume, and acquiring said second magnetic resonance scan data with said second magnetic resonance data acquisition sequence from a second acquisition volume, with said second acquisition volume being a sub-volume of said first acquisition volume and said second acquisition volume containing at least a part of said examination region in which said interference object is situated.

10. A method as claimed in claim 1 comprising generating the interference mitigation attenuation map using (a) and, in (a):

selecting said first magnetic resonance data acquisition sequence from the group consisting of FLASH 3D VIBE, DIXON MAVRIC, UTE MAVRIC, and 3D TSE DIXON, and selecting said second magnetic resonance data acquisition sequence from the group consisting of TSE, TSE VAT, SEMAC and MAVRIC.

11. A combined magnetic resonance emission tomography apparatus comprising:
- a magnetic resonance emission tomography scanner comprising a first plurality of scanner components operable as a magnetic resonance scanner and a second plurality of scanner components operable as an emission tomography scanner;
- a control computer configured to operate said combined magnetic resonance emission tomography scanner as said magnetic resonance scanner while an examination object situated in an examination region of the combined magnetic resonance emission tomography scanner, and while an interference object is present in the examination region that produces a magnetic interference field, so as to execute a magnetic resonance data acquisition sequence in order to acquire magnetic resonance scan data from the examination object, with at least some of said magnetic resonance data being perturbed by magnetic interference produced by said magnetic interference field;
- said control computer configured to operate said combined magnetic resonance emission tomography scanner as said emission tomography scanner to acquire emission tomography scan data from the examination object situated in the examination region of the combined magnetic resonance emission tomography scanner, by detecting events produced by a radioactive substance in said examination object, said events proceeding through tissue in the examination subject before detection thereof;
- an evaluation computer provided with the acquired magnetic resonance scan data and the acquired emission tomography scan data;
- said evaluation computer being configured to use the acquired magnetic resonance scan data to generate an interference-mitigated attenuation map of said tissue in which an effect of said magnetic interference caused by said interference object is mitigated by one of:
  - (a) operating said combined magnetic resonance emission tomography scanner to acquire said magnetic resonance scan data from the examination object, by acquiring first magnetic resonance scan data from the examination object by executing a first magnetic resonance data acquisition sequence, and by acquiring second magnetic resonance data from the examination object by executing a second magnetic resonance data acquisition sequence, generating a provisional attenuation map using said first magnetic resonance scan data, and adjusting said provisional attenuation map using said second magnetic resonance scan data, thereby generating an adjusted attenuation map as said interference-mitigated attenuation map, or
  - (b) generating interference object information using said magnetic resonance scan data, said interference object information representing at least one characteristic of a material of said interference object, and generating said interference-mitigated attenuation map by filling signal cancellations in said magnetic resonance scan data, caused by said interference object, with a linear attenuation coefficient that is derived from said interference object information;
- said evaluation computer being configured to use said interference-mitigated attenuation map in execution of an algorithm for attenuation correction of the emission tomography scan data so as to produce attenuation corrected emission tomography scan data in which said effect of said magnetic interference caused by said interference object is also mitigated; and
- said evaluation computer being configured to make the attenuation corrected emission tomography scan data available in electronic form as a data file from said evaluation computer.

12. A non-transitory, computer-readable data storage medium encoded with programming instructions, said storage medium being loaded into a control and evaluation computer of a combined magnetic resonance emission tomography apparatus that comprises a combined magnetic resonance emission tomography scanner, said programming instructions causing said control and evaluation computer to:
- operate the combined magnetic resonance emission tomography scanner as a magnetic resonance scanner while an examination object is situated in an examination region of the combined magnetic resonance emission tomography scanner, and while an interference object is present in the examination region that produces a magnetic interference field, so as to execute a magnetic resonance data acquisition sequence in order to acquire magnetic resonance scan data from the examination object, with at least some of said magnetic resonance data being perturbed by magnetic interference produced by said magnetic interference field;
- operate said combined magnetic resonance emission tomography scanner as an emission tomography scanner to acquire emission tomography scan data from the examination object situated in the combined magnetic resonance emission tomography scanner, by detecting events produced by a radioactive substance in said examination object, said events proceeding through tissue in the examination subject before detection thereof;
- use the acquired magnetic resonance scan data to generate an interference-mitigated attenuation map of said tissue in which an effect of said magnetic interference caused by said interference object is mitigated by one of:
  - (a) operating said combined magnetic resonance emission tomography scanner to acquire said magnetic resonance scan data from the examination object, by acquiring first magnetic resonance scan data from the examination object by executing a first magnetic resonance data acquisition sequence, and by acquiring second magnetic resonance data from the examination object by executing a second magnetic resonance data acquisition sequence, generating a provisional attenuation map using said first magnetic resonance scan data, and adjusting said provisional attenuation map using said second magnetic resonance scan data, thereby generating an adjusted attenuation map as said interference-mitigated attenuation map, or
  - (b) generating interference object information using said magnetic resonance scan data, said interference object information representing at least one characteristic of a material of said interference object, and generating said interference-mitigated attenuation map by filling signal cancellations in said magnetic resonance scan data, caused by said interference object, with a linear attenuation coefficient that is derived from said interference object information;

use said interference-mitigated attenuation map in execution of an algorithm for attenuation correction of the emission tomography scan data, so as to produce attenuation corrected emission tomography scan data in which said effect of said magnetic interference caused by said interference object is also mitigated; and make the attenuation corrected emission tomography scan data available in electronic form as a data file from said control and evaluation computer.

\* \* \* \* \*